(12) United States Patent
Lee et al.

(10) Patent No.: US 8,969,106 B2
(45) Date of Patent: Mar. 3, 2015

(54) LASER IRRADIATION APPARATUS AND METHOD OF MANUFACTURING ORGANIC LIGHT-EMITTING DISPLAY APPARATUS USING THE SAME

(71) Applicant: Samsung Display Co., Ltd., Yongin, Gyeonggi-Do (KR)

(72) Inventors: June-Woo Lee, Yongin (KR); Kwan-Wook Jung, Yongin (KR); Guang-Hai Jin, Yongin (KR); Jae-Beom Choi, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 33 days.

(21) Appl. No.: 13/831,214

(22) Filed: Mar. 14, 2013

(65) Prior Publication Data

US 2014/0099738 A1 Apr. 10, 2014

(30) Foreign Application Priority Data

Oct. 9, 2012 (KR) ........................ 10-2012-0112098

(51) Int. Cl.
| | |
|---|---|
| H01L 21/00 | (2006.01) |
| H01L 51/00 | (2006.01) |
| H01L 21/67 | (2006.01) |
| B23K 26/12 | (2014.01) |
| B23K 26/40 | (2014.01) |

(52) U.S. Cl.
CPC ...... *H01L 51/0014* (2013.01); *H01L 21/67011* (2013.01); *B23K 26/127* (2013.01); *B23K 26/403* (2013.01); *B23K 26/409* (2013.01)
USPC .................... 438/22; 438/99; 257/40; 257/79

(58) Field of Classification Search
None
See application file for complete search history.

(56) References Cited

U.S. PATENT DOCUMENTS

| | | | |
|---|---|---|---|
| 8,188,476 | B2 | 5/2012 | Takagi et al. |
| 2002/0098614 | A1* | 7/2002 | Akai ................................ 438/82 |
| 2006/0289504 | A1* | 12/2006 | Hegedus ....................... 219/704 |
| 2007/0080356 | A1* | 4/2007 | Nakayama et al. ............. 257/88 |
| 2007/0084553 | A1 | 4/2007 | Nakajima et al. |
| 2008/0287028 | A1* | 11/2008 | Ozawa ............................ 445/24 |

FOREIGN PATENT DOCUMENTS

| | | |
|---|---|---|
| JP | 2007-11926 A | 5/2007 |
| KR | 10-2007-0016785 A | 2/2007 |
| KR | 10-2010-0009319 A | 1/2010 |
| KR | 10-2010-0011034 A | 2/2010 |
| KR | 10-2010-0047796 | 5/2010 |

* cited by examiner

*Primary Examiner* — Andres Munoz
(74) *Attorney, Agent, or Firm* — Christie, Parker & Hale, LLP

(57) ABSTRACT

A laser irradiation apparatus including a chamber configured to receive a panel including an organic layer on a substrate, a laser oscillator outside the chamber, and configured to irradiate a laser beam onto the panel in the chamber, and a transparent window at a side of the chamber, and configured to allow the laser beam to pass therethrough, wherein the laser beam is configured to remove at least a portion of the organic layer on the substrate.

9 Claims, 5 Drawing Sheets

LASER IRRADIATION APPARATUS AND METHOD OF MANUFACTURING ORGANIC LIGHT-EMITTING DISPLAY APPARATUS USING THE SAME

CROSS-REFERENCE TO RELATED PATENT APPLICATION

This application claims priority to and the benefit of Korean Patent Application No. 10-2012-0112098, filed on Oct. 9, 2012, in the Korean Intellectual Property Office, the disclosure of which is incorporated herein in its entirety by reference.

BACKGROUND

1. Field

One or more aspects of embodiments of the present invention relate to a laser irradiation apparatus, and a method of manufacturing an organic light-emitting display apparatus using the same.

2. Description of the Related Art

Recently, conventional display apparatuses have been replaced with portable thin-film flat display apparatuses. Among flat display apparatuses, organic light-emitting display apparatuses are self-emitting display apparatuses having a larger viewing angle, better contrast characteristics, and a faster response rate than other display apparatuses, and thus have drawn attention as next-generation display apparatuses.

An organic light-emitting display apparatus includes an intermediate layer, a first electrode, and a second electrode. The intermediate layer includes an organic emissive layer. When a voltage is applied to the first and second electrodes, visible light is emitted from the organic emissive layer.

SUMMARY

According to aspects of embodiments of the present invention, a laser irradiation apparatus is capable of removing an organic layer (or a portion thereof) formed on an auxiliary cathode electrode. According to other aspects of embodiments of the present invention, a method of manufacturing an organic light-emitting display apparatus includes using the laser irradiation apparatus described above.

According to an embodiment of the present invention, there is provided a laser irradiation apparatus including a chamber configured to receive a panel including an organic layer on a substrate, a laser oscillator outside the chamber, and configured to irradiate a laser beam onto the panel in the chamber, and a transparent window at a side of the chamber, and configured to allow the laser beam to pass therethrough, wherein the laser beam is configured to remove at least a portion of the organic layer on the substrate.

The panel may further include an auxiliary electrode and a pixel electrode on the substrate, and the organic layer may be on the auxiliary electrode and the pixel electrode.

The auxiliary electrode and the pixel electrode may include a same material.

The auxiliary electrode and the pixel electrode may be spaced from each other.

The laser oscillator may be configured to irradiate the laser beam onto the organic layer on the auxiliary electrode to remove the at least the portion of the organic layer.

The laser oscillator may be movable with respect to the organic layer, and may be configured to irradiate the laser beam onto the organic layer on the auxiliary electrode.

The transparent window may be configured to allow the laser beam to pass therethrough.

An inside of the chamber may be configured to be maintained in a vacuum state to prevent deterioration of the organic layer.

The laser irradiation may further include a pump for maintaining an inside of the chamber in a vacuum state.

According to another aspect of the present invention, there is provided a method of manufacturing an organic light-emitting display apparatus, the method including preparing a panel including an auxiliary electrode and a pixel electrode on a substrate, forming an organic layer on the auxiliary electrode and the pixel electrode, and removing at least a portion of the organic layer from the auxiliary electrode by irradiating a laser beam onto the organic layer.

The auxiliary electrode and the pixel electrode may include a same material.

The auxiliary electrode and the pixel electrode may be spaced from each other.

The removing of the at least the portion of the organic layer may include transferring the panel into a chamber of a laser irradiation apparatus, irradiating the laser beam on the at least the portion of the organic layer formed on the auxiliary electrode, and removing the at least the portion of the organic layer from the auxiliary electrode.

Irradiating the laser beam may include irradiating the laser beam by a laser oscillator located outside the chamber.

The method may further include transmitting the laser beam into the chamber through a transparent window of the chamber.

The method may further include moving the laser oscillator with respect to the auxiliary electrode to irradiate the laser beam onto the organic layer on the auxiliary electrode.

The method may further include maintaining an inside of a chamber in which the panel is placed in a vacuum state to avoid deterioration of the organic layer.

The vacuum state may be maintained by a pump coupled to the chamber.

The panel may include a thin film transistor on the substrate, a passivation film covering the thin film transistor, a pixel electrode on the passivation film and coupled to the thin film transistor, and a pixel defining film on the passivation film, and having a first aperture for exposing the pixel electrode, and a second aperture for exposing the auxiliary electrode.

BRIEF DESCRIPTION OF THE DRAWINGS

The above and other aspects of embodiments of the present invention will become more apparent by describing in detail exemplary embodiments thereof with reference to the attached drawings in which.

DETAILED DESCRIPTION

Hereinafter, a structure and operation of embodiments of the present invention will be described in detail with reference to the accompanying drawings, in which exemplary embodiments of the present invention are shown.

As used herein, the term "and/or" includes any and all combinations of one or more of the associated listed items. Expressions such as "at least one of," when preceding a list of elements, modify the entire list of elements and do not modify the individual elements of the list.

Figure 1:
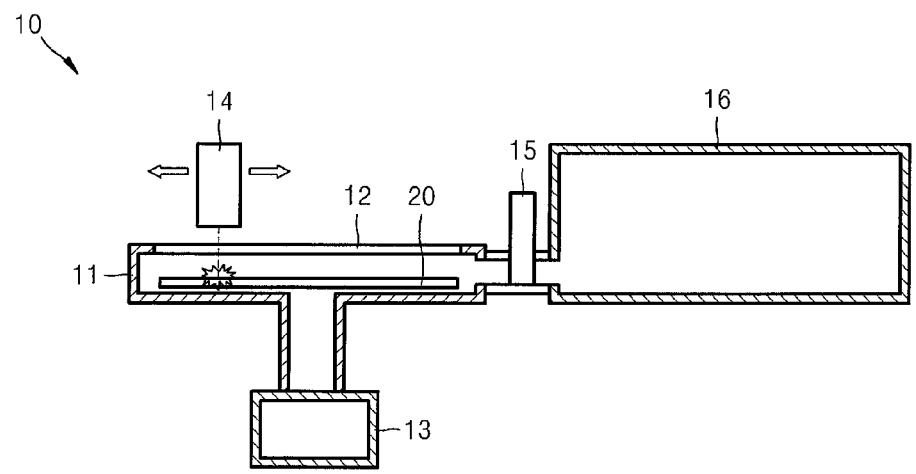
FIG. 1 schematically illustrates a laser irradiation apparatus according to an embodiment of the present invention.

FIG. 1 schematically illustrates a laser irradiation apparatus 10 according to an embodiment of the present invention. Referring to FIG. 1, the laser irradiation apparatus 10 includes a chamber 11, a transparent window 12, a pump 13, and a laser oscillator 14.

A panel 20 is placed in the chamber 11 during manufacture of an organic light-emitting display apparatus. At a side of the chamber 11, there may be located manufacturing equipment 16 for manufacturing the organic light-emitting display apparatus. The panel 20 may be transferred into the chamber 11 from a deposition apparatus or other equipment. In the chamber 11, an organic layer (e.g., an organic layer 111 of FIG. 2) formed on the panel 20, or a portion thereof, may be removed, as will be described below. A door 15 may be located between the chamber 11 and the manufacturing equipment 16, and may be opened when the panel 20 is transferred to the chamber 11 from the manufacturing equipment 16, or when the panel 20 is transferred to the manufacturing equipment 16 from the chamber 11, and may be closed when the panel 20 is located in the chamber 11.

Figure 2:
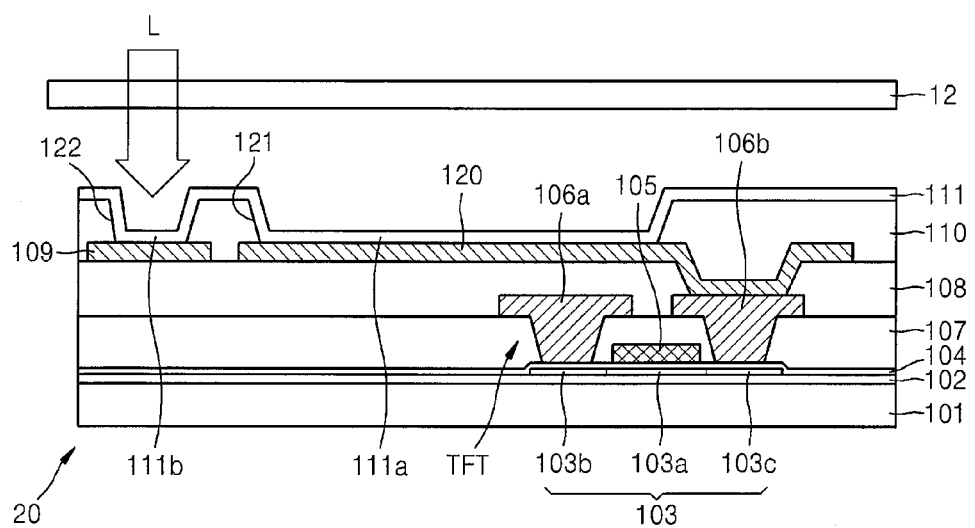
FIG. 2 is a cross-sectional view of a panel of an organic light-emitting display apparatus, which is irradiated by a laser beam according to an embodiment of the present invention.

The inside of the chamber 11 is maintained in a vacuum state, such that the organic layer 111 of FIG. 2 on the panel 20 is not damaged. A pump 13 may be located at a side of the chamber 11, and may be connected to the chamber 11 to control pressure in the chamber 11 such that the inside of the chamber 111 of FIG. 2 is maintained in a vacuum state to avoid damaging the organic layer on the panel 20. The pump 13 may be a cryopump.

The transparent window 12 may be located at another side of the chamber 11, and may allow a laser beam to pass therethrough. In other words, the transparent window 12 may allow the transmission of a laser beam L that is emitted from a laser oscillator 14 outside the chamber 11 to reach the panel 20 in the chamber 11.

The laser oscillator 14 generates the laser beam L and irradiates it onto the panel 20 in the chamber 11. The organic layer on the panel 20 may be removed by the laser beam L. The laser oscillator 14 is located outside the chamber 11. The laser beam L generated in the chamber 11 is incident into the chamber 11 via the transparent window 12. The laser beam L incident into the chamber 11 may be irradiated onto the panel 20 to remove the organic layer on the panel 20. As described above, in the laser irradiation apparatus 10 according to the current embodiment, the laser oscillator 14 is outside the chamber 11, rather than inside the chamber 11. Thus, the size of the chamber 11 may be reduced or minimized while still allowing the panel 20 to be located therein. Also, since the laser oscillator 14 is located outside the chamber 11, the vacuum state of the chamber 11 may be sustained.

FIG. 2 is a cross-sectional view of a panel 20 of an organic light-emitting display apparatus on which a laser beam is irradiated according to an embodiment of the present invention. Referring to FIG. 2, the panel 20 includes a thin film transistor (TFT) formed on a substrate 101, an interlayer insulating film 107 for covering the TFT, a passivation film 108 formed on the interlayer insulating film 107, and a pixel defining film 110, a pixel electrode 120, an auxiliary electrode 109, and the organic layer 111 that are formed on the passivation film 108. The panel 20 is described in detail below.

The auxiliary electrode 109 and the pixel electrode 120 are spaced apart from each other. A portion of a surface of the pixel electrode 120 is exposed via a first aperture 121 of the pixel defining film 110, and another portion of the surface of the auxiliary electrode 109 is exposed via a second aperture 122 of the pixel defining film 110. The organic layer 111 may be formed on the auxiliary electrode 109 and on the pixel electrode 120. A portion 111a of the organic layer 111 (see FIG. 2) on the pixel electrode 120 emits light between the pixel electrode 120 and an opposite electrode 112 (see FIG. 10).

Figure 10:
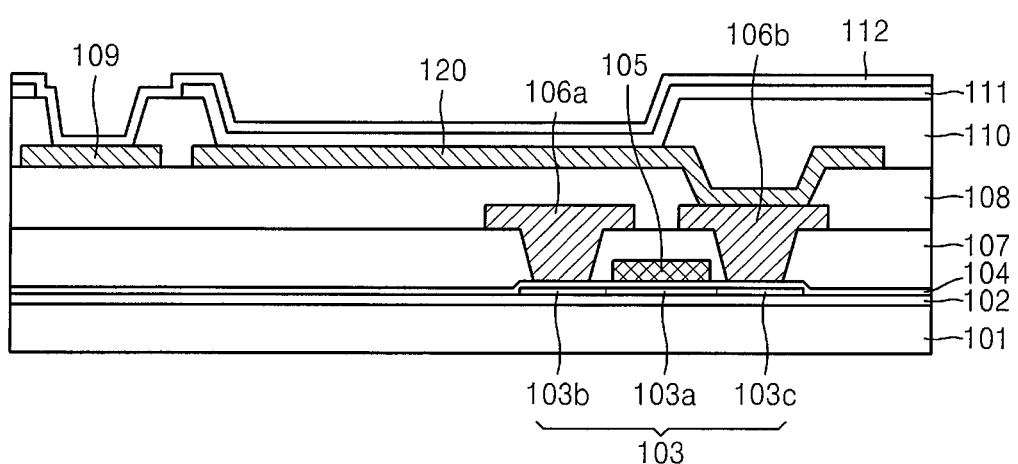

However, the auxiliary electrode 109 directly contacts the opposite electrode 112 (see FIG. 10). Thus, a portion 111b of the organic layer 111 (see FIG. 2) formed on the auxiliary electrode 109 should be removed before the opposite electrode 112 is formed. After the organic layer 111 is formed on the panel 20, the panel 20 is transferred into the chamber 11 of the laser irradiation apparatus 10, and the organic layer 111 on the auxiliary electrode 109 is partially removed by the laser irradiation apparatus 10. That is, after the panel 20 is transferred into the chamber 11, the door 15 is closed and the pressure in the chamber 11 is maintained in a vacuum state so that the organic layer 111 may avoid being deteriorated. The laser oscillator 14 is moved to the panel 20 and irradiates a laser beam L onto the portion 111b of the organic layer 111 to be removed from the auxiliary electrode 109, thereby removing that portion 111b of the organic layer 111.

FIGS. 3 to 10 are cross-sectional views sequentially illustrating a method of manufacturing an organic light-emitting display apparatus according to an embodiment of the present invention.

Figure 3:
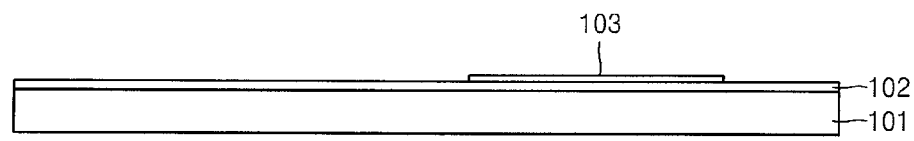
FIGS. 3 to 10 are cross-sectional views sequentially illustrating a method of manufacturing an organic light-emitting display apparatus according to an embodiment of the present invention.

First, as illustrated in FIG. 3, an auxiliary layer 102 is formed on a substrate 101. Specifically, the substrate 101 may be formed of a $SiO_2$-based transparent glass material, but is not limited thereto, and may be formed of any of other various materials, e.g., a transparent plastic material and/or a metal material.

An auxiliary layer 102, such as a barrier layer, a blocking layer, or a buffer layer, may be formed on the substrate 101 to prevent or reduce impurity ions from penetrating into the substrate 101, to protect the substrate 101 against moisture or ambient air, and to planarize a surface of the substrate 101. The auxiliary layer 102 may be formed of $SiO_2$ and/or $SiN_x$ by any of various deposition methods, e.g., plasma enhanced chemical vapor deposition (PECVD), atmospheric pressure CVD (APCVD), low pressure CVD (LPCVD), and the like.

An active layer 103 of a TFT is formed on the auxiliary layer 102. For example, a polycrystalline silicon layer may be formed by depositing an amorphous silicon layer on the auxiliary layer 102 and crystallizing the amorphous silicon layer. The amorphous silicon layer may be crystallized by any of various methods, such as, for example, rapid thermal annealing (RTA), solid phase crystallization (SPC), excimer laser annealing (ELA), metal induced crystallization (MIC), metal induced lateral crystallization (MILC), and sequential lateral solidification (SLS). Then, the polycrystalline silicon layer may be patterned to obtain the active layer 103 of the TFT, according to a masking process.

Figure 4:
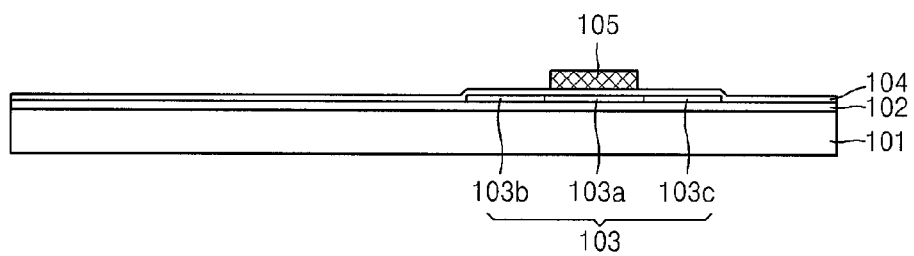

Then, as illustrated in FIG. 4, a gate insulating film 104 is formed on the entire substrate 101 to cover the active layer 103, and a gate electrode 105 is formed on the gate insulating film 104 to correspond to the active layer 103.

The gate insulating film 104 may be formed of, for example, an inorganic insulating film such as $SiN_x$ or $SiO_x$, by PECVD, APCVD, or LPCVD. The gate insulating film 104 is located between the active layer 103 of the TFT and the gate electrode 105 to insulate the active layer 103 and the gate electrode 105 from each other.

The gate electrode 105 is formed to correspond to a center of the active layer 103. Source and drain regions 103b and 103c and a channel region 103a therebetween are formed on edges of the active layer 103 corresponding to respective sides of the gate electrode 105 by doping n-type or p-type impurities onto active layer 103 by using the gate electrode 105 as a self-align mask. Here, the impurities may be, for example, boron (B) ions or phosphor (P) ions.

The gate electrode 105 may include, for example, at least one material selected from the group consisting of Ag, Mg, Al, Pt, Pd, Au, Ni, Nd, Ir, Cr, Li, Ca, Mo, Ti, W, MoW, and Cu. According to a modified embodiment of the present invention, the gate electrode 105 may have a three-storied structure including Mo, Al, and Mo.

Figure 5:
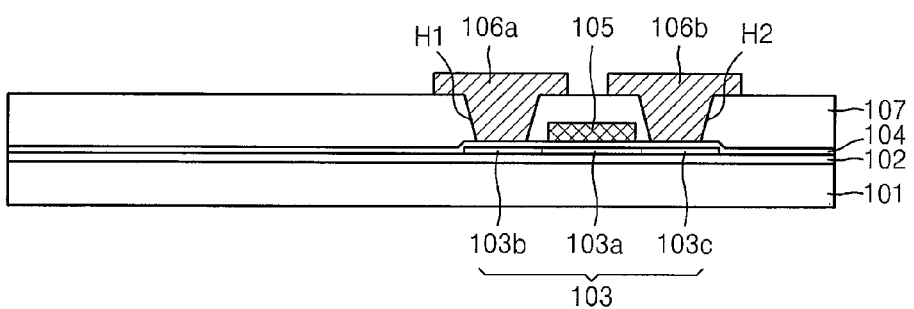

Then, as illustrated in FIG. 5, an interlayer insulating film 107 is formed on the entire substrate 101 on which the gate electrode 105 is formed, and source and drain electrodes 106a and 106b are formed to correspond to the source and drain regions 103b and 103c, respectively.

The interlayer insulating film 107 may be formed of, for example, at least one organic insulating material selected from the group consisting of polyimide, polyamide, acrylic resin, benzocyclobutene, and phenolic resin, according to a spin coating method. The interlayer insulating film 107 is formed to be sufficiently thick, for example, thicker than the gate insulating film 104, thereby insulating the gate electrode 105 of the TFT and the source and drain electrodes 106a and 106b. Alternatively, the interlayer insulating film 107 may be formed of, for example, an inorganic insulating material, such as that used to form the gate insulating film 104, instead of the organic insulating material described above, or may be formed by alternately stacking an organic insulating material and an inorganic insulating material.

Via holes H1 and H2 (see FIG. 5) are formed in the interlayer insulating film 107 to expose the source and drain regions 103b and 103c. The via hole H1 exposes a portion of the source region 103b, and the via hole H2 exposes a portion of the drain region 103c.

After the via holes H1 and H2 are formed in the interlayer insulating film 107, a conductive layer may be formed on the interlayer insulating film 107 such that the via holes H1 and H2 are filled with the conductive layer. The conductive layer may be patterned to obtain the source and drain electrodes 106a and 106b according to a masking process.

Figure 6:
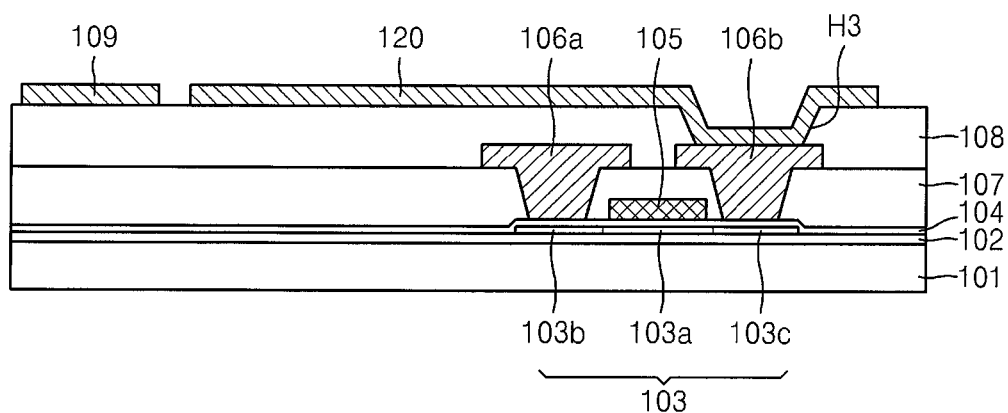

Then, referring to FIG. 6, a passivation film 108 is formed on the entire substrate 101 on which the source and drain electrodes 106a and 106b are formed. The passivation film 108 may be formed of an inorganic insulating material. A contact hole H3 is formed in the passivation film 108 to expose a portion of the drain electrode 106b. The pixel electrode 120 and the drain electrode 106b contact each other via the contact hole H3.

After the passivation film 108 is formed, a conductive layer may be formed on the passivation film 108, and the conductive layer may be patterned to obtain a pixel electrode 120 and an auxiliary electrode 109. As described above, the pixel electrode 120 contacts the drain electrode 106b via the contact hole H3. The pixel electrode 120 and the auxiliary electrode 109 may be formed of the same material, and according to the same process.

Figure 7:
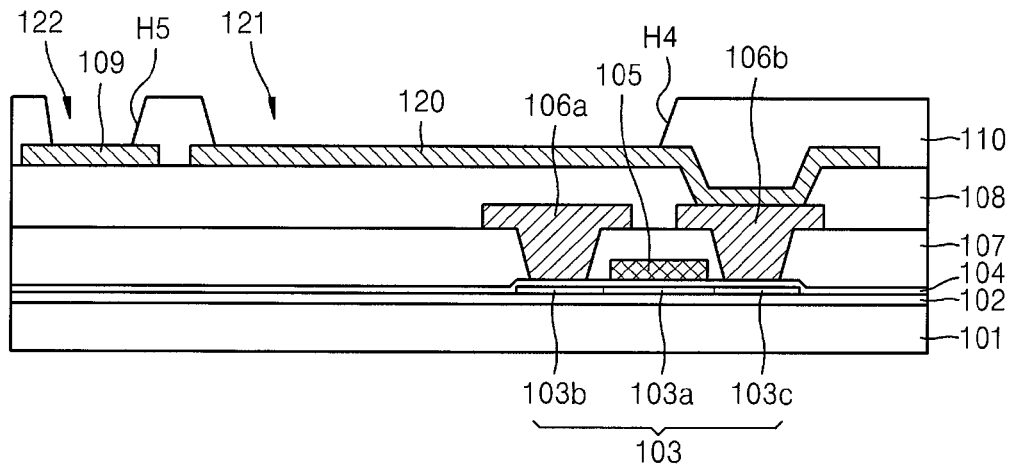

Then, as illustrated in FIG. 7, a pixel define layer (PDL) (e.g., pixel defining film) 110 is formed on the substrate 101.

An insulating layer may be formed on the entire substrate 101 on which the pixel electrode 120 and the auxiliary electrode 109 are formed. The insulating layer may be formed of, for example, at least one organic insulating material selected from the group consisting of polyimide, polyamide, acrylic resin, benzocyclobutene, and phenolic resin, according to a spin coating method. Alternatively, the insulating layer may be formed of, for example, at least one inorganic insulating material selected from the group consisting of $SiO_2$, $SiN_x$, $Al_2O_3$, $CuO_x$, $Tb_4O_7$, $Y_2O_3$, $Nb_2O_5$, and $Pr_2O_3$. Furthermore, the insulating layer may be formed in a multilayer structure in which an organic insulating material and an inorganic insulating material are alternately stacked.

The insulating layer is patterned according to a masking process, thereby obtaining holes H4 and H5 via which a central portion of the pixel electrode 120 and a central portion of the auxiliary electrode 109 are respectively exposed. A first aperture 121 is formed by the hole H4, and a second aperture 122 is formed by the hole H5. The first aperture 121 exposes a portion of the pixel electrode 120, and the second aperture 122 exposes a portion of the auxiliary electrode 109.

Figure 8:
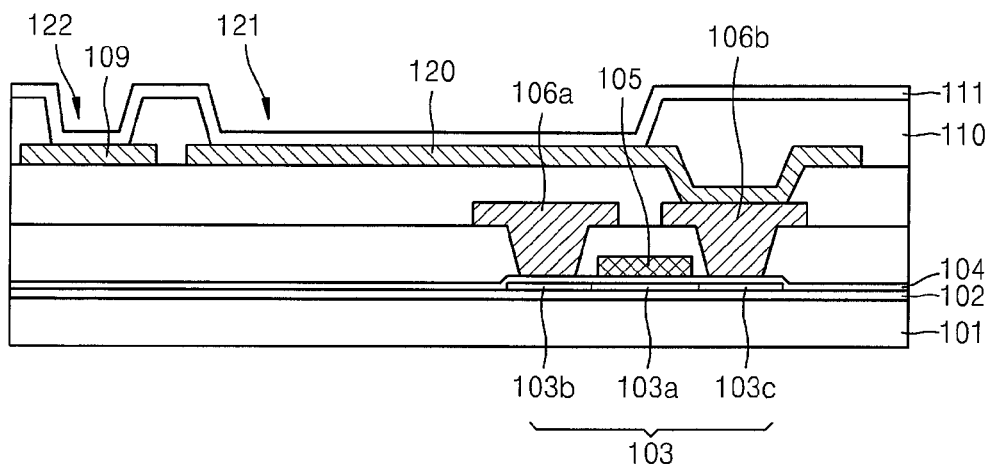

Then, as illustrated in FIG. 8, an organic layer 111 including an emissive layer is formed in the first and second apertures 121 and 122 that respectively expose the pixel electrode 120 and the auxiliary electrode 109.

The organic layer 111 may be formed in a single-layer or multilayer form including at least one among an emissive layer (EML), and other function layers, e.g., a hole transport layer (HTL), a hole injection layer (HIL), an electron transport layer (ETL), and an electron injection layer (EIL).

The emissive layer may include a low molecular-weight material or a high molecular-weight material. When the emissive layer includes the low molecular-weight material, in the organic layer 111, the hole transport layer and the hole injection layer are stacked in that order toward the pixel electrode 120, and the electron transport layer and the electron injection layer are stacked in that order toward the opposite electrode 112, around the emissive layer. In addition, other various layers may be stacked if needed or desired. In the present embodiment, examples of an available organic material include copper phthalocyanine (CuPc), N,N'-Di(naphthalene-1-yl)-N, N'-diphenyl-benzidine (NPB), and tris-8-hydroxyquinoline aluminum ($Alq_3$).

When the emissive layer includes the high molecular-weight material, the organic layer 111 might include only the hole transport layer around the emissive layer in the direction of the pixel electrode 120. The hole transport layer may be formed on the pixel electrode 120 by using poly-2,4-ethylene-dihydroxy thiophene (PEDOT), polyaniline (PANI), or the like, by inject printing or spin coating. In the present embodiment, examples of an available organic material include a poly-phenylenevinylene (PPV) or polyfluorene-based polymeric organic material. A color pattern may be used according to a general method, e.g., inject printing, spin coating, or a thermal transfer method using laser.

Figure 9:
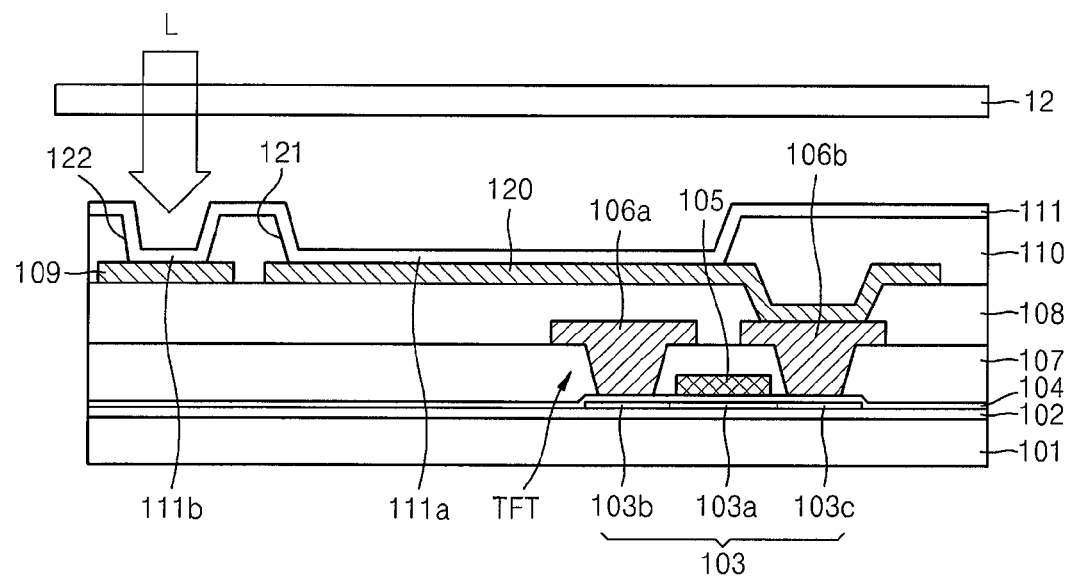

Then, as illustrated in FIG. 9, the portion 111b of the organic layer 111 is removed from the auxiliary electrode 109.

After the organic layer 111 is formed, the panel 20 is transferred into the chamber 11 of the laser irradiation apparatus 10 to remove the organic layer 111b. After the panel 20 is transferred into the chamber 11, the door 15 is closed, and pressure in the chamber 11 is maintained in a vacuum state to avoid degeneration (e.g., deterioration) of the organic layer 111. The laser oscillator 14 is moved to the panel 20 and irradiates a laser beam L on the portion 111b of the organic layer 111 to be removed from the auxiliary electrode 109, thereby removing that portion 111b of the organic layer 111.

Then, as illustrated in FIG. 10, an opposite electrode 112 is formed on the substrate 101 to not only cover the organic layer 111, but to also contact the auxiliary electrode 109.

The opposite electrode 112 may be deposited as a common electrode on the entire substrate 101. In the present embodiment, the pixel electrode 120 functions as an anode electrode and the opposite electrode 112 functions as a cathode electrode. The opposite electrode 112 may contact the auxiliary electrode 109 to reduce a resistance (e.g., voltage drop) of the opposite electrode 112.

According to an embodiment of the present invention, a size of a chamber that should be maintained in a vacuum state may be reduced or minimized.

While embodiments of the present invention have been particularly shown and described with reference to exemplary embodiments thereof, it will be understood by those of ordinary skill in the art that various changes in form and details may be made therein without departing from the spirit and scope of the present invention as defined by the following claims, and their equivalents.

What is claimed is:

1. A method of manufacturing an organic light-emitting display apparatus, the method comprising:
    preparing a panel comprising an auxiliary electrode and a pixel electrode on a substrate;
    forming an organic layer on the auxiliary electrode and the pixel electrode while the panel is in a manufacturing equipment; and
    removing at least a portion of the organic layer from the auxiliary electrode by irradiating a laser beam onto the organic layer, the removing of the at least the portion of the organic layer comprising:
        transferring the panel from the manufacturing equipment into a chamber of a laser irradiation apparatus;
        closing a door separating the chamber from the manufacturing equipment;
        irradiating the laser beam on the at least the portion of the organic layer formed on the auxiliary electrode while the panel is in the chamber; and
        removing the at least the portion of the organic layer from the auxiliary electrode.

2. The method of claim 1, wherein the auxiliary electrode and the pixel electrode comprise a same material.

3. The method of claim 1, wherein the auxiliary electrode and the pixel electrode are spaced from each other.

4. The method of claim 1, wherein irradiating the laser beam comprises irradiating the laser beam by a laser oscillator located outside the chamber.

5. The method of claim 4, further comprising transmitting the laser beam into the chamber through a transparent window of the chamber.

6. The method of claim 4, further comprising moving the laser oscillator with respect to the auxiliary electrode to irradiate the laser beam onto the organic layer on the auxiliary electrode.

7. The method of claim 1, further comprising maintaining an inside of the chamber in which the panel is placed in a vacuum state to avoid deterioration of the organic layer.

8. The method of claim 7, wherein the vacuum state is maintained by a pump coupled to the chamber.

9. The method of claim 1, wherein the panel comprises:
    a thin film transistor on the substrate;
    a passivation film covering the thin film transistor;
    the pixel electrode on the passivation film and coupled to the thin film transistor; and
    a pixel defining film on the passivation film, and having a first aperture for exposing the pixel electrode, and a second aperture for exposing the auxiliary electrode.

* * * * *